United States Patent [19]
Gazsi et al.

[11] Patent Number: 5,130,943
[45] Date of Patent: Jul. 14, 1992

[54] METHOD AND CONFIGURATION FOR IMPROVING THE DYNAMIC RANGE OF AN ADAPTIVE RECURSIVE NETWORK FOR PROCESSING DISCRETE-TIME SIGNALS

[75] Inventors: Lajos Gazsi; Dieter Brückmann, both of Düsseldorf, Fed. Rep. of Germany

[73] Assignee: Siemens Aktiengesellschaft, Munich, Fed. Rep. of Germany

[21] Appl. No.: 538,842

[22] Filed: Jun. 15, 1990

[30] Foreign Application Priority Data

Jun. 16, 1989 [EP] European Pat. Off. ....... 89 111 019.9

[51] Int. Cl.$^5$ .............................................. G06F 15/31
[52] U.S. Cl. ........................... 364/724.19; 364/724.17
[58] Field of Search ................... 364/724.19, 724.14, 364/724.17

[56] References Cited
U.S. PATENT DOCUMENTS 4,843,583  6/1989  White et al. .................... 364/724.19
4,989,170  1/1991  Batruni et al. ................. 364/724.19

OTHER PUBLICATIONS

Horvath, "Adaptive Rekursive Entcerrer für die Schnele Datenübertragung" Diss.ETH 5860, Zürich Switzerland, 1977, pp. 34–35 & 48–49.

Proceedings of the IEEE, vol. 64, No. 11, Nov. 1976, pp. 1583–1597, New York, US: Man Mohan Sondhi et al.: "New Results on the Performance of a Well-Known Class of Adaptive Filters".

International Conference on Digital Signal Processing, Aug. 30–Sep. 2, 1978. Florence, IT, pp. 1–8: S. Horvath: "A New Adaptive Recursive LMS Filter".

*Primary Examiner*—David H. Malzahn
*Attorney, Agent, or Firm*—Herbert L. Lerner; Laurence A. Greenberg

[57] ABSTRACT

In a method and configuration for improving the dynamic range of an adaptive recursive network for processing discrete-time signals, gradient signals are formed from output signals of the network with respect to network parameters. The output signals of the network are compared with set-point signals to form differential signals. Signals of a signum function of the gradient signals are formed. The signals of the signum function are multiplied with the differential signals to form correction signals proportional to the product of the signals of the signum function and the differential signals.

6 Claims, 2 Drawing Sheets

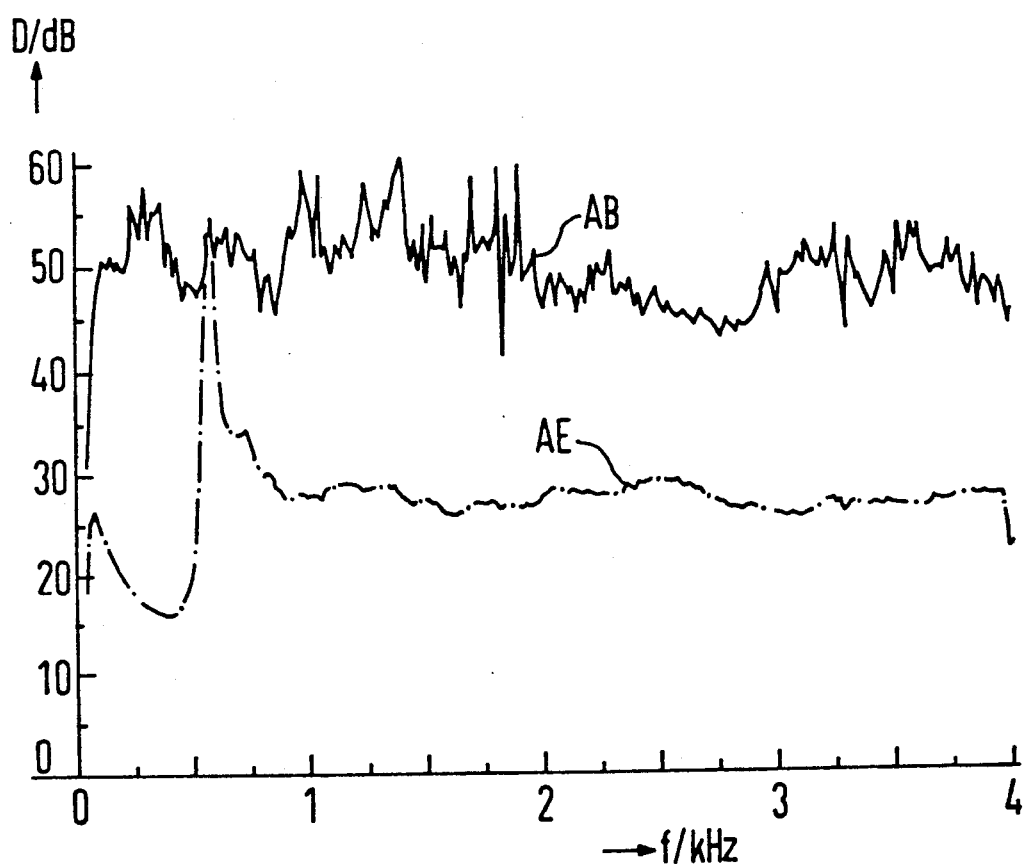

METHOD AND CONFIGURATION FOR IMPROVING THE DYNAMIC RANGE OF AN ADAPTIVE RECURSIVE NETWORK FOR PROCESSING DISCRETE-TIME SIGNALS

The invention relates to a method and configuration for improving the dynamic range of an adaptive recursive network for processing discrete-time signals, in which output signals of the network are compared with set-point signals to form differential signals, and the differential signals in turn are linked with gradient signals formed from the output signals of the network with respect to the network parameters to form correction signals.

Adaptive networks, such as adaptive digital filters, are of major significance in many areas of discrete-time signal processing, particularly in the fields of systems analysis, echo compensation in two-wire/four-wire transitions, line distortion correction and speech processing. In comparison with constant networks, the characteristic of such adaptive networks is that the network parameters that determine the transfer properties are optimally adjusted with respect to a Q function. A Q function of this kind is obtained, for instance, by minimizing the mean quadratic error of the output signal at the adaptive network with respect to a reference signal. For instance, D. A. Pierre in Optimization Theory with Applications (John Wiley and Sons, New York, 1969), discloses a method in which the partial derivations (gradient) of the Q function are formed in accordance with the network parameters to be adapted. For most quality criteria, that method can be ascribed to the formation of the partial derivations of the output signal of the adaptive network in accordance with the network parameters.

A method of that kind is described, for instance, in Published European Application No. 89 109 086. In that method, the partial derivations of the output signal of the adaptive network are calculated in accordance with the various parameters with the aid of a gradient network.

Wave digital filters, which are not only suitable for providing fixed transfer functions but are also excellently well suited for the implementation of adaptive systems, are a typical example of recursive networks for processing discrete-time signals. Wave digital filters include both delay means and adaptors. The adaptors, in turn, are made up of adders or subtracters as well as multipliers, that is amplifiers. Various transfer functions can be set with the aid of the multiplier coefficients. With an adaptive wave digital filter, the multiplier coefficients represent the network parameters, which are variable and automatically adjust to the desired values. Gradient networks can also be provided by means of wave digital filters.

In networks of that type, correction terms or correction signals must be formed to modify the individual parameters that are to be adapted. Such correction signals are obtained from the products of the gradient signals, in other words from the partial derivations of the network output signals in accordance with the various parameters, with differential signals that are formed by a comparison of the filter output signals with set-point signals. In principle, the thus-formed product signals must multiplied by an additional damping factor K, in order to assure stability in the modification loop under all circumstances. The modification loop is formed due to the fact that the correction signals are further processed in a network that determines the current values for the various parameters and then sets the current parameter values in the adaptive network or gradient network.

In adaptive networks of that type, problems can occur in terms of the scaling, if the representable value range is given and if the numerical range is, for instance, limited to $-1 \leq X \leq 1 - 2^{-n}$ with the word length n (fixed point arithmetic). In order to attain the desired transfer functions, the modulation capacity of the network must remain within the defined range upon the variation of the parameters, which is dictated by the adaptive system, so that no saturation effects can arise. The damping factor K is obtained from power considerations and is selected in such a way that even under the most unfavorable conditions, or in other words maximal values of the input and gradient signals, stability is assured. Typically, the damping factor K is selected as the reciprocal of twice the number of parameters to be adapted.

With that value of the damping factor K adapted to the most unfavorable conditions, the adaptation speed at low signal levels of the input and/or gradient signals becomes correspondingly slower, because the correction signals for the parameters, which are dependent on those signals, becomes smaller. An improvement can be attained if the power of the gradient signals is determined and the correction signals for the parameters are multiplied by the reciprocal value of the power. However, for networks with a limited numerical range, the method entails major expenditure.

A method is known from an article by M. Sondhi and D. Mitra, entitled "New Results on the Performance of a Well-Known Class of Adaptive Filters", Proceedings IEEE, Vol. 64, No. 11, pp. 1583–1597, November 1976, for adaptive finite impulse response (FIR) filters, that is, non-recursive networks, in which the correction signals for the parameters are selected proportionally to the product of the signals of the signum function of the differential signals and the signals of the signum function of the gradient signals. However, that method has the decisive disadvantage of requiring the proportionality factor to be selected to be quite small, so that the parameters in the adaptive state do not undergo major variations. Furthermore, non-recursive networks cannot be adopted for recursive networks, because the latter are substantially more complex.

It is accordingly an object of the invention to provide a method and configuration for improving the dynamic range of an adaptive recursive network for processing discrete-time signals, which overcome the hereinafore-mentioned disadvantages of the heretofore-known methods and devices of this general type.

With the foregoing and other objects in view there is provided, in accordance with the invention, a method for improving the dynamic range of an adaptive recursive network for processing discrete-time signals, which comprises forming gradient signals from output signals of the network with respect to network parameters, comparing the output signals of the network with set-point signals to form differential signals, forming signals of a signum function of the associated gradient signal, and multiplying the signals of the signum function with the associated differential signal to form correction signals proportional to the product of the signals of the signum function and the differential signals.

In accordance with another mode of the invention, there is provided a method which comprises forming a proportionality factor for the correction signal from the reciprocal value of twice the number of the parameters of the network to be adapted.

With the objects of the invention in view, there is also provided a configuration for improving the dynamic range of an adaptive recursive network for processing discrete-time signals, comprising means for forming gradient signals from output signals of the adaptive recursive network with respect to network parameters, means for comparing the output signals of the adaptive recursive network with set-point signals to form differential signals, means for forming signals of a signum function of the gradient signals having an input for receiving the gradient signals and an output, and a multiplier having an input side connected to the output of the signum function signal forming means and to the comparing means for multiplying the signals of the signum function with the associated differential signal to form correction signals proportional to the product of the signals of the signum function and the differential signals.

In accordance with another feature of the invention, there is provided an amplifier connected downstream of the multiplier having an amplification factor equivalent to the reciprocal value of twice the number of the parameters of the network to be adapted.

In accordance with a concomitant feature of the invention, there are provided gradient networks each forming a gradient signal, each gradient network including a recursive subnetwork portion and a non-recursive subnetwork portion emitting the gradient signals.

An advantage of the invention is that in adaptive recursive networks for processing discrete-time signals, it enables a wide dynamic range with stable network behavior. As a consequence, there is good noise performance and optimal utilization of the scaling range. The invention also has the advantage of making it possible to lower the costs of constructing the gradient network or networks.

Other features which are considered as characteristic for the invention are set forth in the appended claims.

Although the invention is illustrated and described herein as embodied in a method and configuration for improving the dynamic range of an adaptive recursive network for processing discrete-time signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 3 is a graph showing the output signal of a known network in comparison with the output signal of a network of the kind shown in FIG. 2.

Figure 1:
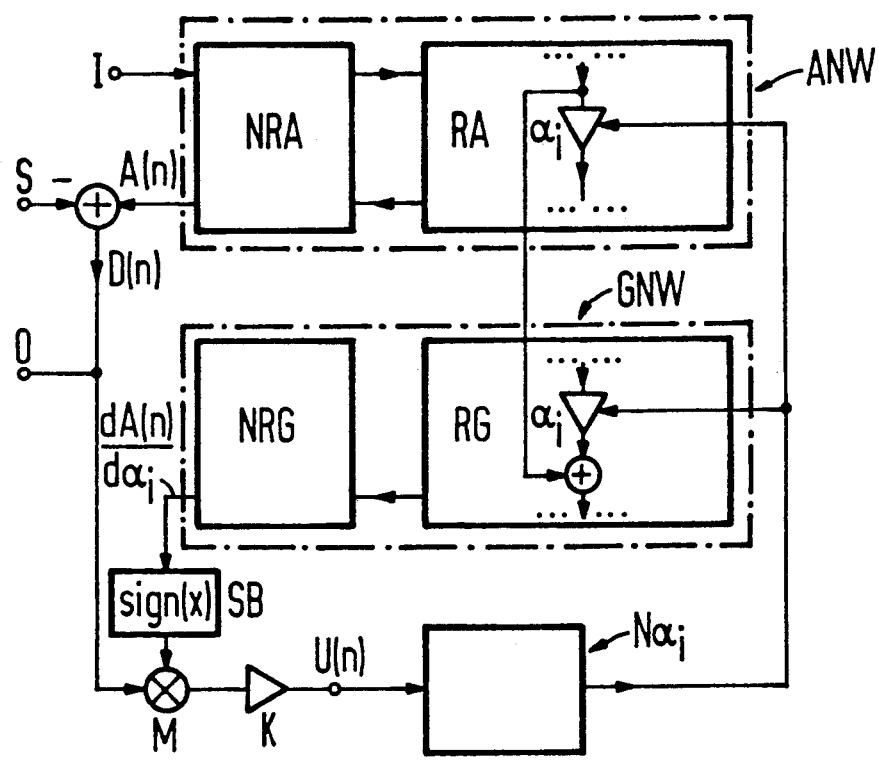
FIG. 1 is a basic schematic and block circuit diagram of an adaptive recursive network according to the invention.

Referring now to the figures of the drawings in detail and first, particularly, to FIG. 1 thereof, there is seen an adaptive recursive network made up of a plurality of subnetworks. The actual adaptive network ANW includes a recursive adaptive subnetwork portion RA, which is dependent parameters $a_i$ of the network, and a non-recursive subnetwork portion NRA, which receives input signals at inputs I and supplies output signals A(n) at outputs. The recursive and non-recursive subnetwork portions are connected to one another for transferring signals.

Each gradient network GNW belonging to the adaptive network ANW is also formed of a recursive gradient subnetwork portion RG and a non-recursive subnetwork portion NRG. The recursive subnetwork portion RG likewise depends on the parameters $a_i$. In order to form gradient signals $dA(n)/da_i$ of the output signals A(n) of the adaptive network ANW, the recursive gradient subnetwork portion RG receives signals from the recursive adaptive subnetwork portion RA. After processing of the output signals of the subnetwork portion RG in the non-recursive subnetwork portion NRG, the gradient signals $dA(n)/da_i$ are available at the output of that subnetwork portion. Either one or more input and output signals can each be provided for the adaptive network ANW. The number of gradient signals is oriented to the output signals and the number of parameters. The gradient signals are the partial derivations of the output signals in accordance with the various network parameters.

For the sake of simpler illustration, only one gradient network for the parameter $a_i$ is shown in FIG. 1. The network of FIG. 1 is illustrated as an adaptive wave digital filter, which is formed of adders and multipliers, and which can be provided for both the adaptive network and the gradient networks.

Error or differential signals D(n) are formed from the output signal or signals A(n) by comparison with signals of a set-point input S, as schematically indicated by a subtracter that is not shown in detail. The differential signal D(n) is applied on one hand to an output O of the network configuration and on the other to an input of a multiplier M. Another input of the multiplier M is connected to a configuration SB for forming the signum function. The gradient signal or signals $dA(n)/da_i$ serve as the input signal for the signum former SB. The multiplier M is followed by an amplifier with an amplification or damping factor K, which furnishes a correction signal or signals U(n). The correction signals are delivered to a network $Na_i$, which ascertains the current values for the parameters $a_i$ of the adaptive and gradient-forming networks from the correction signals, with the aid of known methods.

The correction signals U(n) are thus obtained as the product of the factor K of the amplifier, the differential signal D(n) and the signum function of the gradient signal with respect to the particular parameter. The signum function is defined in such a way that its value is equal to +1 for arguments >0; its value is equal to −1 for arguments <0, and its value is equal to 0 for the argument 0. The argument n of the signals is defined in the range of integers. The damping factor K preferably is equivalent to twice the number M of parameters to be adapted or coefficients $a_i$. The following equations are thus obtained:

$$U(n) = K \cdot D(n) \cdot \text{sign}\frac{dA(n)}{da_i} \qquad (1)$$

-continued $$\text{sign}(x) = \begin{cases} +1 & \text{for } x > 0 \\ 0 & \text{for } x = 0, \\ -1 & \text{for } x < 0 \end{cases} \quad (2)$$

$$K = 1/2 \, m \quad (3)$$

$$n = \ldots -1, 0, +1, \ldots \quad (4)$$

where m is the number of adaptation parameters $a_i$.

From these equations, particularly equation (1), it becomes clear that according to the invention, only the algebraic sign (+ or −) of the gradient signals is needed for the correction signals U(n). Since the damping factor K is typically maintained unchanged with respect to the relationship known from the prior art, from this it follows that the correction signals are in principle substantially larger than in the prior art. At the same time, full stability of the network configuration is obtained. A considerable improvement in the dynamic range of the network configuration is obtained in this way. A further advantage of the method and apparatus according to the invention is that simplifications are possible for the gradient filter because work only needs to be done with one-bit accuracy in the non-recursive subnetwork portion NRG.

Figure 2:
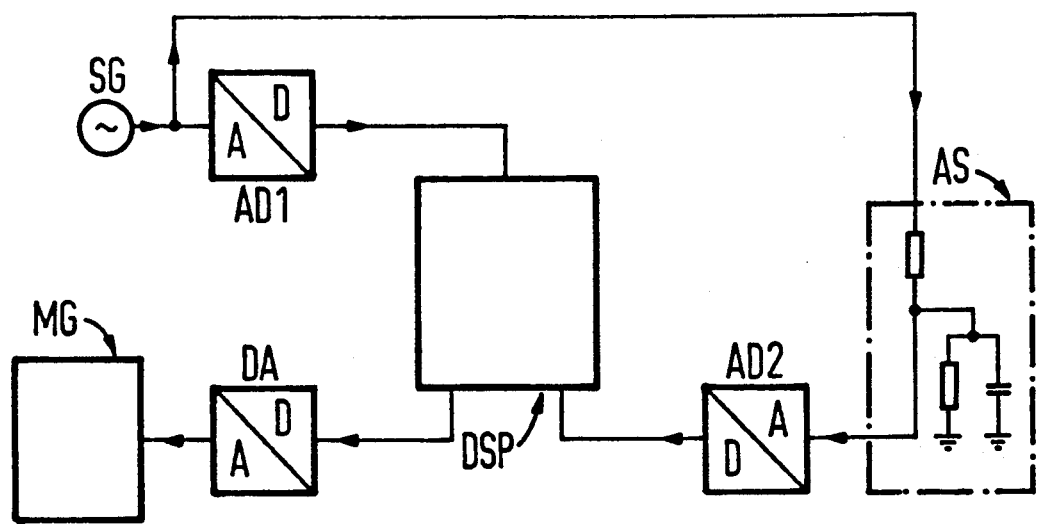
FIG. 2 is a basic circuit diagram of a test configuration with a network according to the invention.

In order to explain the method according to the invention, FIG. 2 shows a test layout with an adaptive recursive network configuration according to the invention as shown in FIG. 1, which has been implemented for a digital signal process DSP. The adaptive recursive network configuration operates according to the method of the invention. The signal processor DSP is connected to the analog world around it through two analog/digital converters AD1 and AD2 and one digital/analog converter DA. The system is supplied by a sine generator SG, the frequency of which is wobbled through in the range from 0 to 4 kHz. The output signal of the sine generator SG serves both as the input signal for an analog transfer segment AS and as a reference signal for the digital signal processor DSP through the analog/digital converter AD1. The analog transfer segment AS is symbolically represented by a complex voltage divider. The signal reflected by the transfer segment AS is likewise fed through the other analog/digital converter AD2 into the signal processor DSP in the form of an echo signal. The signal processor includes an adaptive recursive network configuration in the form of an echo compensator, which is formed of a wave digital filter having an 8 kHz scanning rate and a transfer function which is intended to match the analog transfer function as well as possible in the frequency range from 0 to 4 kHz. In a wave digital filter, the multiplier coefficients are equivalent to the adaptive parameters.

The difference between the network or filter output signal and the echo signal forms the differential signal which is delivered as an error signal through the digital/analog converter DA and can be recorded with a measuring instrument MG.

FIG. 3 is a graph showing two measurement curves for attained echo damping D with an adaptive first order wave digital filter having three coefficients $a_i$. A signal course AB is obtained with the known method for generating the correction signals. A signal course AE is obtained when the method according to the invention is used to form the correction signals. The signal course AE can be seen to be distinguished by considerably better damping than the signal course AB attained with the known method. Moreover, the expenditure required is less than that for the known method.

We claim:

1. Method for influencing the dynamic range of an adaptive recursive network for processing discrete-time signals, which comprises forming gradient signals from output signals generated by the network with respect to network parameters, providing set-point signals, comparing the output signals generated by the network with the set-point signals to form differential signals, forming signals of a signum function of the gradient signals, and multiplying and signals of the signum function with the differential signals to form correction signals proportional to the product of the signals of the signum function and the differential signals.

2. Method according to claim 1, which comprises forming a proportionality factor for the correction signal from the reciprocal value of twice the number of the parameters of the network to be adapted.

3. Configuration for influencing the dynamic range of an adaptive recursive network for processing discrete-time signals, comprising means for forming gradient signals from output signals generated by the adaptive recursive network with respect to network parameters, means for conducting set-point signals, means for comparing the output signals generated by the adaptive recursive network with the set-point signals to form differential signals, means for forming signals of a signum function of the gradient signals having an input for receiving the gradient signals and an output, and a multiplier having an input side connected to the output of said signum function signal forming means and to said comparing means for multiplying the signals of the signum function with the differential signals to form correction signals proportion al to the product of the signals of the signum function and the differential signals.

4. Configuration according to claim 3, wherein said multiplier has an output, including an amplifier connected to said output of said multiplier, said amplifier having an amplification factor equivalent to the reciprocal value of twice the number of the parameters of the network to be adapted.

5. Configuration according to claim 3, wherein said means for forming gradient signals are in the form of a gradient network forming the gradient signals, said gradient network including a recursive subnetwork portion and a non-recursive subnetwork portion emitting the gradient signals.

6. Configurations according to claim 4, wherein said means for forming gradient signals are in the form of a gradient network forming the gradient signals, said gradient network including a recursive subnetwork portion and a non-recursive subnetwork portion emitting the gradient signals.

* * * * *